(12) United States Patent
Cho

(10) Patent No.: US 7,501,883 B2
(45) Date of Patent: Mar. 10, 2009

(54) APPARATUS AND METHOD FOR GENERATING INTERNAL VOLTAGE ADAPTIVELY FROM EXTERNAL VOLTAGE

(75) Inventor: Jong-Ho Cho, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 147 days.

(21) Appl. No.: 11/403,258

(22) Filed: Apr. 13, 2006

(65) Prior Publication Data

US 2007/0024363 A1 Feb. 1, 2007

(30) Foreign Application Priority Data

Jul. 18, 2005 (KR) ...................... 10-2005-0064721

(51) Int. Cl.
*G05F 1/10* (2006.01)
(52) U.S. Cl. ...................................... 327/540; 327/530
(58) Field of Classification Search ................. 327/530, 327/538–544; 323/312–317
See application file for complete search history.

(56) References Cited

U.S. PATENT DOCUMENTS

| | | | | |
|---|---|---|---|---|
| 4,596,978 | A * | 6/1986 | Fujita | 341/159 |
| 4,999,630 | A * | 3/1991 | Masson | 341/120 |
| 5,463,395 | A * | 10/1995 | Sawai | 341/156 |
| 5,828,604 | A * | 10/1998 | Kawai et al. | 365/185.22 |
| 5,929,696 | A * | 7/1999 | Lim et al. | 327/540 |
| 6,078,210 | A * | 6/2000 | Uchida et al. | 327/530 |
| 6,239,652 | B1 * | 5/2001 | Oh et al. | 327/541 |
| 6,784,704 | B2 * | 8/2004 | Sato | 327/143 |
| 6,867,573 | B1 * | 3/2005 | Carper | 323/277 |
| 7,095,270 | B2 * | 8/2006 | Liu | 327/540 |
| 2002/0130710 | A1 * | 9/2002 | Mahrla | 327/540 |
| 2003/0226041 | A1 * | 12/2003 | Palmer et al. | 713/202 |
| 2004/0021505 | A1 * | 2/2004 | Watanabe | 327/540 |
| 2004/0041595 | A1 * | 3/2004 | Ogawa et al. | 327/94 |

FOREIGN PATENT DOCUMENTS

| | | |
|---|---|---|
| JP | 6103748 | 4/1994 |
| JP | 2005071325 | 3/2005 |
| KR | 20040048294 | 6/2004 |

OTHER PUBLICATIONS

English Abstract for Publication No. JP6103748.
English Abstract for Publication No. 2004-0048294.
English Abstract for Publication No. 2005-071325.

* cited by examiner

*Primary Examiner*—Lincoln Donovan
*Assistant Examiner*—Thomas J Hiltunen
(74) *Attorney, Agent, or Firm*—F. Chau & Assoc., LLC

(57) ABSTRACT

Provided are an apparatus and method for generating an internal voltage adaptively with respect to an external supply voltage. The apparatus includes a class detector and an internal voltage generator. The class detector outputs detection signals indicating a class of a plurality of classes, which correspond to predetermined voltages, to which an input external voltage belongs with respect to a first reference voltage. The internal voltage generator generates and outputs an internal voltage corresponding to the class to which the external voltage belongs as indicated by the detection signals.

15 Claims, 4 Drawing Sheets

APPARATUS AND METHOD FOR GENERATING INTERNAL VOLTAGE ADAPTIVELY FROM EXTERNAL VOLTAGE

CROSS-REFERENCE TO RELATED PATENT APPLICATIONS

This application claims the benefit of Korean Patent Application No. 10-2005-0064721, filed on Jul. 18, 2005, in the Korean Intellectual Property Office, the disclosure of which is incorporated by reference herein.

BACKGROUND OF THE INVENTION

1. Field of the Invention

The present invention relates to an apparatus and method for generating an internal voltage adaptively from an external voltage, and more particularly, to an apparatus and method for generating an internal voltage adaptively from an external voltage supplied from a mobile terminal to supply an operating voltage to a smart card installed in the mobile terminal.

2. Description of the Related Art

Smart cards are plastic cards which include a microprocessor and a memory and thus can store and process information therein. Typically, the size and shape of a smart card are the same as those of a general credit card. A smart card, which is inserted into a mobile terminal based on the Global System for Mobile Communication (GSM) adopted in Europe, has a very small size.

In the field of mobile communications, smart cards have been widely used both as an ID card for identifying a subscriber and a card for processing billing information such as an electronic bill throughout most European countries. Smart cards are classified according to the types of networks in which they are used. In the GSM environment, a Subscribed Identify Module (SIM) card that has a subscriber authentication function and a roaming function is standard. Accordingly, a service provider issues a SIM card to a subscriber, and the subscriber who holds the SIM card can freely use communication services through any mobile terminal anywhere and at any time.

A smart card requires a constant voltage to operate its circuits. Typically, a smart card for use in a mobile terminal uses the battery of the mobile terminal as its power source.

Mobile terminals operating in the GSM environment must satisfy the GSM standard which defines the amount of power consumption, and thus, smart cards for a mobile terminal must operate according to the GSM standard. Accordingly, it is necessary to generate an internal constant voltage adaptively from a voltage supplied. Also, in the case of a smart cart in which a crypto engine is added for security enhancement, the power consumption of the crypto engine must be reduced to increase its operating speed while satisfying the GSM standard.

Since a conventional smart card for a mobile terminal uses an internal constant voltage, current can be over-consumed in a low voltage operation mode, which in turn may limit the driving speed of the crypto engine. Therefore, it is desired to control the amount of current consumption, to meet the GSM standard, and/or improve the performance of the smart card.

SUMMARY OF THE INVENTION

According to an aspect of the present invention, there is provided a voltage generating apparatus including a class detector and an internal voltage generator. The class detector outputs detection signals indicating a class of a plurality of classes, which correspond to predetermined voltages, to which an external voltage belongs with respect to a first reference voltage. The internal voltage generator generates and outputs an internal voltage corresponding to the class to which the external voltage belongs as indicated by the detection signals.

According to another aspect of the present invention, there is provided a voltage generating method. In the method, an external voltage is classified into a class of a plurality of classes, which correspond to predetermined voltages, to which the external voltage belongs. A plurality of detection signals indicating the class to which the external voltage belongs with respect to a first reference voltage is output. An internal voltage corresponding to the class to which the external voltage belongs is generated using the detection signals.

BRIEF DESCRIPTION OF THE DRAWINGS

The above and other features of the present invention will become more apparent by describing in detail exemplary embodiments thereof with reference to the attached drawings in which.

DETAILED DESCRIPTION OF PREFERRED EMBODIMENTS

The present invention will now be described with reference to the accompanying drawings, in which exemplary embodiments of the invention are shown.

Figure 1:
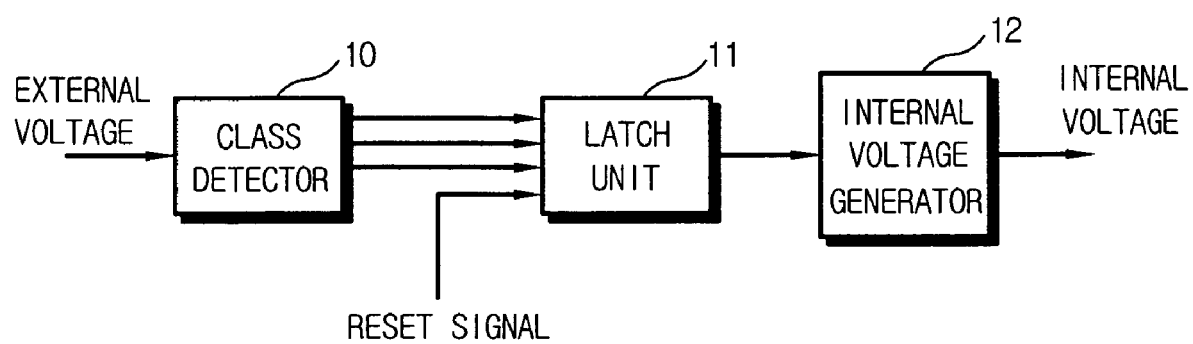
FIG. 1 is a block diagram of an internal voltage generating apparatus according to an embodiment of the present invention.

FIG. 1 is a block diagram of an internal voltage generating apparatus according to an embodiment of the present invention. The internal voltage generating apparatus includes a class detector 10, a latch unit 11, and an internal voltage generator 12.

The class detector 10 detects an operation class of a GSM-based mobile terminal from an external voltage, that is, from a voltage supplied from the battery of the mobile terminal, using a reference voltage. Here, the reference voltage is set such that an operation class determination can be made. In the present embodiment, the reference voltage is set to about 1.2 V.

An operating current for each operation class, defined (or limited) in the GSM standard, is shown in Table 1.

TABLE 1

| Operating frequency | Class C | Class B | Class A |
|---|---|---|---|
| 4 MHz | 4 mA | 6 mA | 10 mA |

In Table 1, 4 MHz indicates an operating frequency.

The internal voltage generator 12 generates an internal voltage so that a smart card operates while satisfying the operation class detected by the class detector 10. Here, the higher the operating current for each class, the greater is the generated internal voltage. That is, the generated internal voltage increases in the order of the classes C, B and A.

The class detector 10 divides the external voltage by the number of classes, compares the divided voltages with the reference voltage, and outputs the comparison results.

The latch unit 11 latches the values output from the class detector 10 in synchronization with a reset signal RESET SIGNAL and outputs the latched values to the internal voltage generator 12, thereby preventing the values output to the internal voltage generator 12 from being sensitive to a change in the external voltage.

The internal voltage generator 12 generates an internal voltage by dividing the external voltage using the latched values, and supplies the internal voltage to the smart card.

Figure 2:
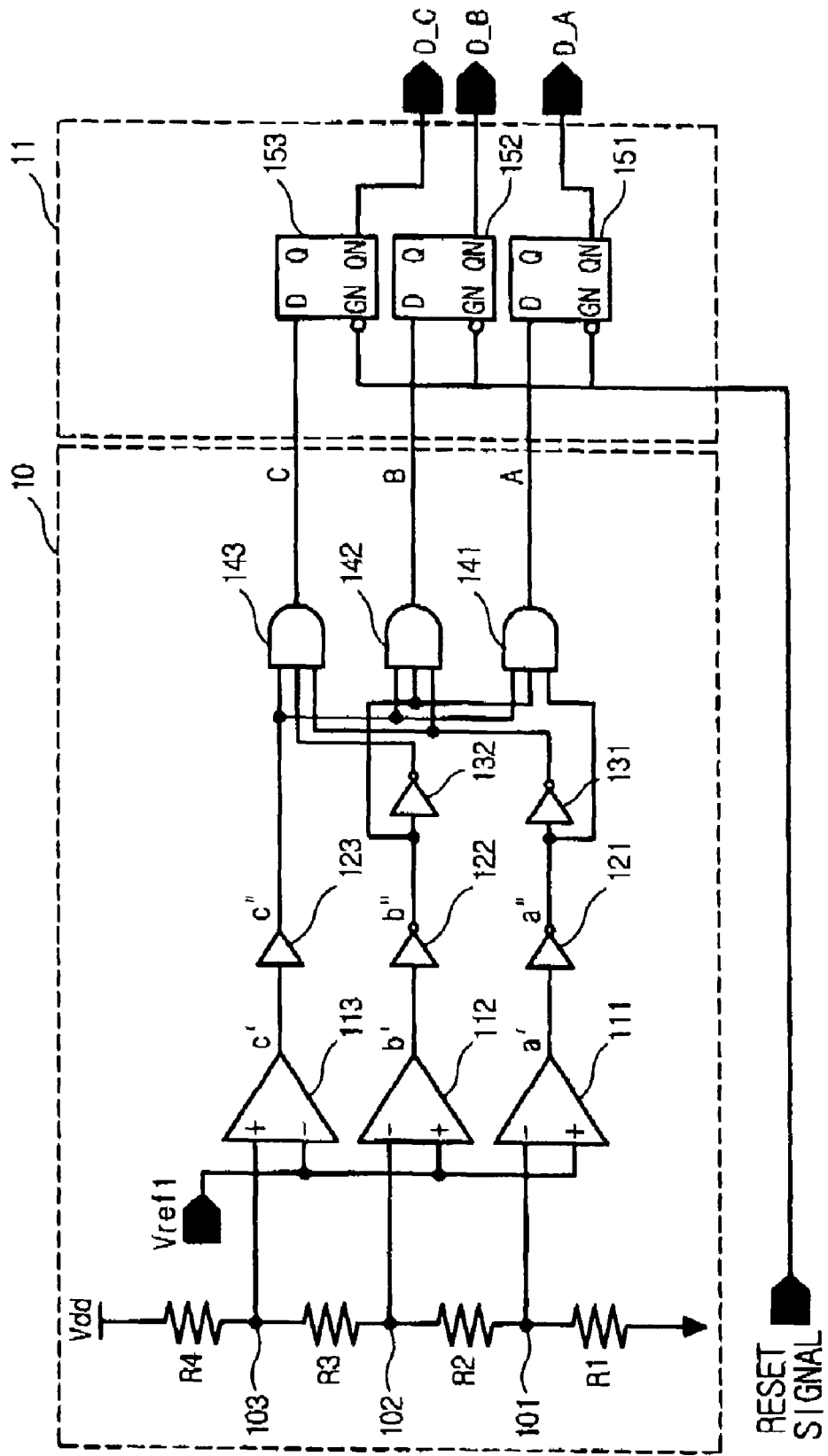
FIG. 2 is a circuit diagram of a class detector and a latch unit illustrated in FIG. 1.

FIG. 2 is a circuit diagram of a class detector and a latch unit illustrated in FIG. 1. Referring to FIG. 2, the class detector 10 includes a plurality of resistors R1, R2, R3 and R4, a plurality of comparators 111, 112, and 113, a buffer 123, a plurality of inverters 121, 122, 131 and 132, and a plurality of logical AND operators 141, 142 and 143.

The resistors R1, R2, R3 and R4 divide the external voltage Vdd. The first comparator 111 receives a voltage of a first node 101 through its negative (−) terminal and a first reference voltage Vref1 through its positive (+) terminal, and compares the two voltages. The second comparator 112 receives a voltage of a second node 102 through its negative (−) terminal and the first reference voltage Vref1 through its positive (+) terminal, and compares the two voltages. The third comparator 113 receives a voltage of a third node 103 through its positive (+) terminal and the first reference voltage Vref1 through its negative (−) terminal, and compares the two voltages.

The inverters 121 and 122 respectively invert signals a' and b' output from the respective comparators 111 and 112 to output digital signals a" and b", and the buffer 123 buffers a signal c' output from the comparator 113 to output a digital signal c".

Figure 3A:
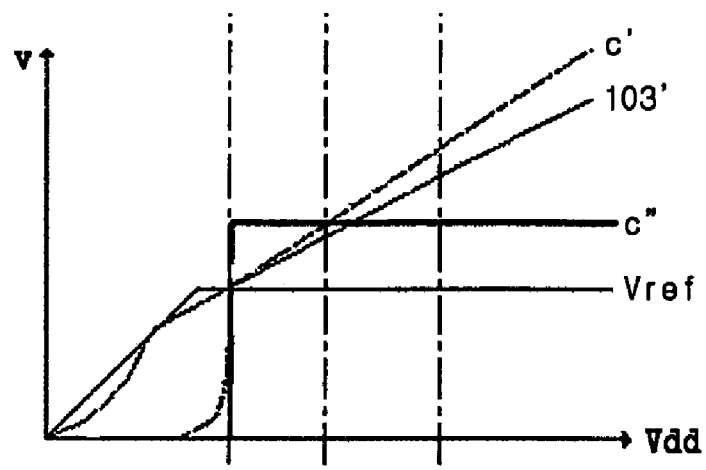
FIG. 3A through 3C illustrate simulation results of digital signals shown in FIG. 2 with respect to an external voltage.
Figure 3B:
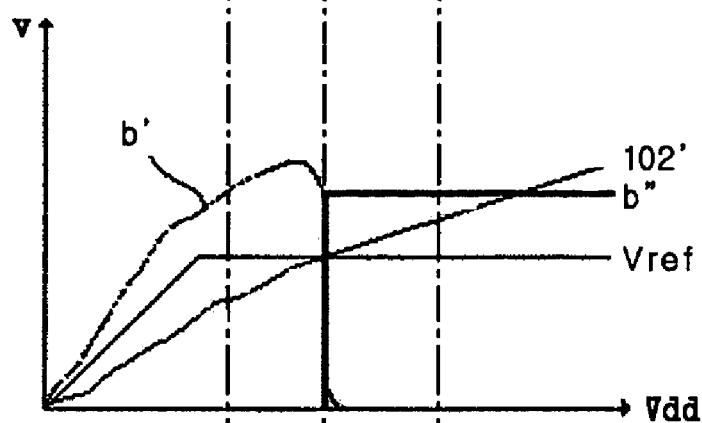
Figure 3C:
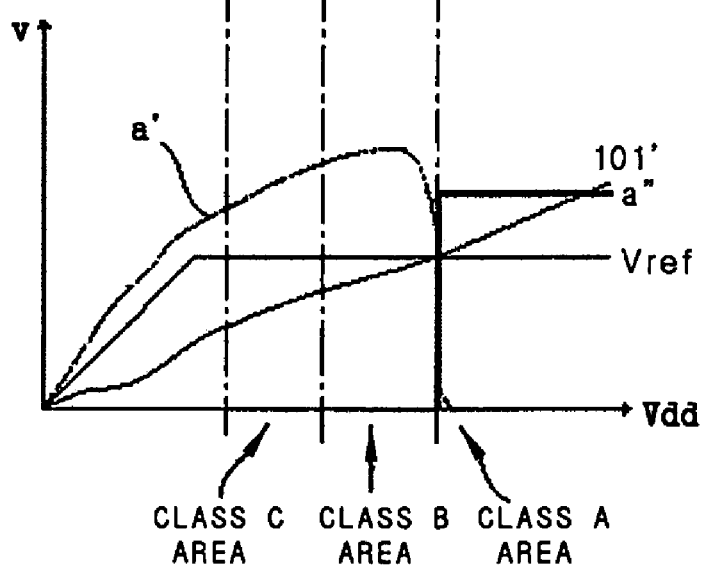

FIG. 3A through 3C illustrate simulation results of digital signals shown in FIG. 2 with respect to an external voltage. Referring to FIG. 3A, a voltage 103' of the third node 103 has values as shown with respect to the external voltage Vdd. If the voltage 103' of the third node 103 exceeds the first reference voltage Vref1, the comparator 113 amplifies a voltage difference between the voltage 103' of the third node 103 and the first reference voltage Vref1 and outputs the signal c'. The buffer 123 converts the signal c' into the digital signal c" that is a logic high.

Referring to FIG. 3B, a voltage 102' of the second node 102 is lower than the voltage 103' of the third node 103 with respect to the external voltage Vdd. Accordingly, the voltage 102' of the second node 102 exceeds the first reference voltage Vref1 at a higher external voltage Vdd than when the voltage 103' of the third node 103 exceeds the first reference voltage Vref1.

The comparator 112 amplifies a voltage difference between the voltage 102' of the second node 102 and the first reference voltage Vref1 and outputs the signal b' in an area which the voltage 102' of the second node 102 is lower than the first reference voltage Vref1. If the voltage 102' of the second node 102 exceeds the first reference voltage Vref1, the comparator 112 outputs substantially zero ("0") volts. The inverter 122 inverts the signal b' into the digital signal b" that is a logic high.

Referring to FIG. 3C, a voltage 101' of the first node 101 is lower than the voltage 102' of the second node 102 with respect to the external voltage Vdd. Accordingly, the voltage 101' of the first node 101 exceeds the first reference voltage Vref1 at a higher external voltage Vdd than when the voltage 102' of the second node 102 exceeds the first reference voltage Vref1. The comparator 111 amplifies a voltage difference between the voltage 101' of the first node 101 and the first reference voltage Vref1 and outputs the signal a' in an area in which the voltage 101' of the first node 101 is lower than the first reference voltage Vref1. If the voltage 101' of the first node 101 exceeds the first reference voltage Vref1, the comparator 111 outputs substantially zero ("0") volts. The inverter 121 inverts the signal a' into a digital signal a" that is a logic high.

In summary, areas in which the voltages 101', 102' and 103' of the respective nodes 101, 102 and 103 reach the first reference voltage Vref1 can be known to be different from one another with respect to the external voltage Vdd. Specifically, in a class C area where the external voltage Vdd is the smallest among the areas, only the digital signal c" becomes a logic high. In a class B area, the digital signals c" and b" becomes logic highs and in a class A area where the external voltage Vdd is the largest among the areas, all the digital signals c", b" and a" become logic highs. That is, output levels in the classes C, B and A areas are different from one another.

Referring to FIG. 2, the inverters 131 and 132 and the logical AND operators 141, 142 and 143 perform logic operations such that each output level corresponding to each of class A, B and C areas is different from one another in order to more accurately discriminate classes A, B and C from the digital signals c", b" and a".

The inverters 131 and 132 invert the digital signals a" and b", respectively.

The respective logical AND operators 141, 142 and 143 selectively receive the digital signals c", b" and a" and the outputs of the inverters 131 and 132, and perform logical AND operations thereon. Specifically, the logical AND operator 141 receives the digital signals c", b" and a" and performs the logical AND operation thereon. The logical AND operator 142 receives the digital signals c" and b" and the output of the inverter 131 and performs the logical AND operation thereon. The logical AND operator 143 receives the digital signal c" and the outputs of the inverters 131 and 132 and performs the logical AND operation thereon. As a result, each of the outputs of the logical AND operators 141, 142, and 143 becomes a logic high for the corresponding one of the class A, B, and C areas, and becomes a logic low for the other class areas.

The latch unit 11 includes a plurality of D-flip-flops 151, 152 and 153. The respective D-flip-flops 151, 152 and 153 latch the respective outputs of the logical AND operators 141, 142 and 143 in synchronization with a reset signal RESET SIGNAL. If the outputs of the logical AND operators 141, 142 and 143 are not latched in synchronization with the reset signal RESET SIGNAL, the output of the internal voltage generator 12 changes when the outputs of the logical AND operators 141, 142 and 143 change due to a change in the external voltage Vdd, thus causing errors in the system logic, for example, including the smart card.

Figure 4:
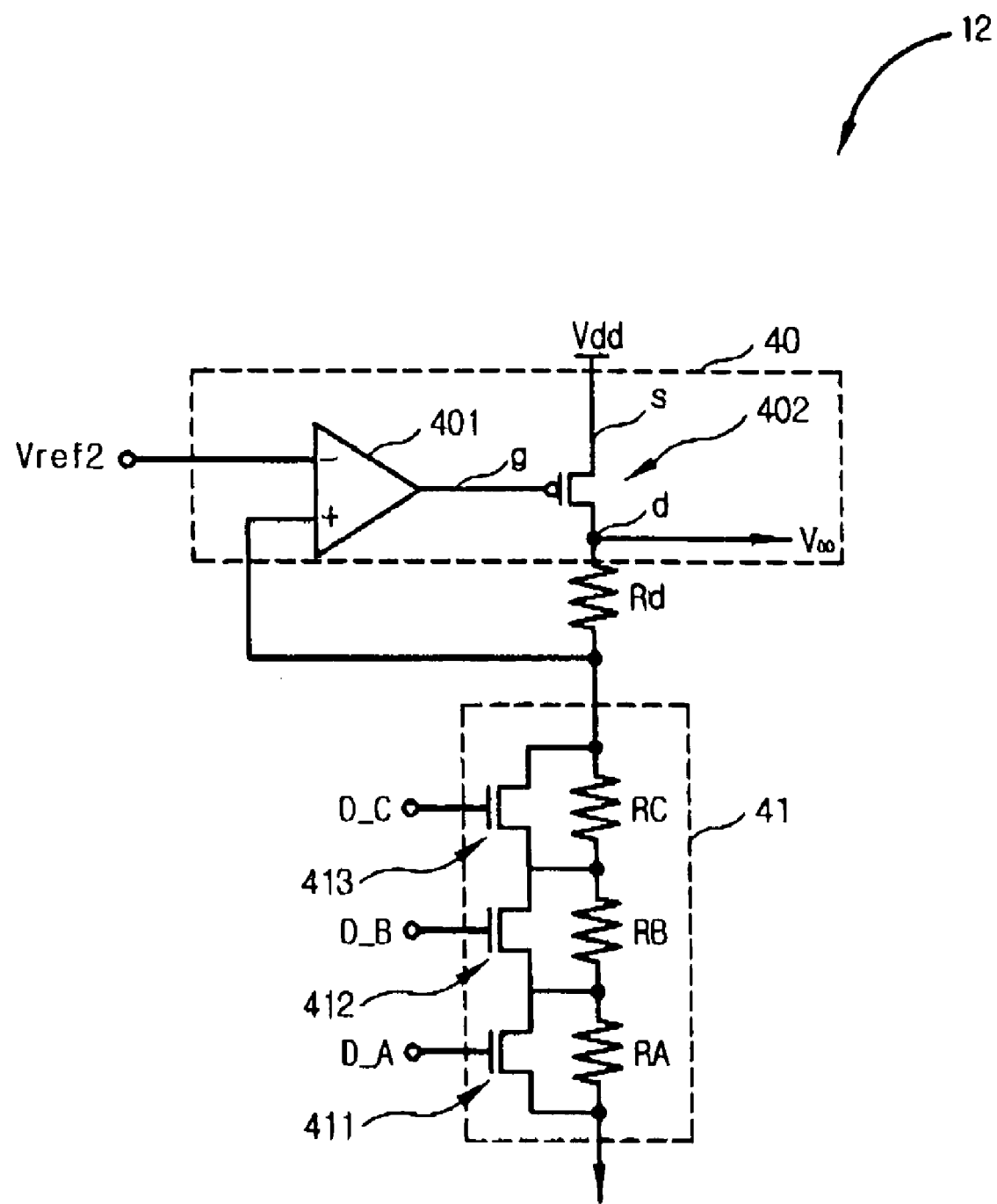
FIG. 4 is a circuit diagram of an internal voltage generator illustrated in FIG. 1.

FIG. 4 is a circuit diagram of an internal voltage generator illustrated in FIG. 1. The internal voltage generator 12 includes a switching unit 40 and a voltage divider 41.

The switching unit 40 includes a comparator 401 and a pMOS transistor 402. The comparator 401 receives a second reference voltage Vref2 through its negative (−) terminal and a voltage across the voltage divider 41 through its positive (+) terminal, and compares the two voltages. The source of the pMOS transistor 402 is connected to an external voltage Vdd and the gate g of the pMOS transistor 402 is connected to the output terminal of the comparator 401, so that the pMOS transistor 402 is turned on when the second reference voltage Vref2 is equal to or higher than the voltage across the voltage divider 41. Here, the second reference voltage Vref2 may be equal to the first reference voltage Vref1 of the class detector 10.

An internal voltage $V_{DD}$ is obtained from the drain d of the pMOS transistor 402. That is, a voltage across a resistor Rd and the voltage divider 41 is output as the internal voltage $V_{DD}$.

The voltage divider 41 is connected to the drain d of the pMOS transistor 402 via the resistor Rd. The voltage divider 41 includes a plurality of resistors RA, RB and RC and a plurality of nMOS transistors 411, 412 and 413 connected in parallel to the respective resistors RA, RB and RC. It is preferable that the resistances of the resistors RA, RB and RC satisfy RA>RB>RC. If the class detector 10 does not include a logical operator unit composed of the inverters 131 and 132 and the logical AND operators 141, 142 and 143, the resistances of the resistors RA, RB and RC may not satisfy RA>RB>RC.

Referring to FIG. 2, the gates of the nMOS transistors 411, 412 and 413 are connected to the respective negative output terminals QN of the latch unit 11, and thus, the nMOS transistors 411, 412 and 413 are turned on when the negative outputs QN of the latch unit 11 become logic highs. For example, if the class detector 10 detects that the external voltage Vdd corresponds to class B, the negative output terminals QN of the latch unit 11 respectively become logic high, logic low and logic high. Accordingly, the nMOS transistor 411 is turned on, the nMOS transistor 412 is turned off, and the nMOS transistor 413 is turned on, so that a voltage across the resistors Rd and RB is generated as the internal voltage $V_{DD}$.

If the outputs of the latch unit 11 are obtained from positive output terminals Q of the D-flip-flops 151, 152 and 153, instead of the negative output terminals QN thereof, the nMOS transistors of the voltage divider 41 can be substituted with pMOS transistors.

According to the present invention, an operation class of a GSM-based mobile terminal is detected from a voltage provided from the mobile terminal, and an internal voltage is generated according to the detected class and applied to a smart card. Thus a mobile smart card can be implemented with its power consumption minimized while satisfying the GSM standard.

Further, it is possible to prevent the mobile smart card from malfunctioning due to a sharp change in a voltage provided from a mobile terminal by latching a class detection result in synchronization with a reset signal and generating an internal voltage by using the latched result.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A voltage generating apparatus comprising:
   a class detector outputting detection signals each indicating a class of a plurality of classes, which correspond to different predetermined voltages, to which an external voltage belongs with respect to a first reference voltage, wherein the class detector includes a voltage divider receiving the external voltage and a plurality of comparators connected to the voltage divider and the first reference voltage and having respective outputs connected to a logic circuit having a plurality of logic elements, whereby a plurality of digital signals are produced as the detection signals corresponding to the plurality of classes;
   an internal voltage generator generating and outputting an internal voltage corresponding to the class to which the external voltage belongs as indicated by the detection signals; and
   a latch unit latching the detection signals output from the class detector in synchronization with a predetermined control signal, and outputting the latched detection signals to the internal voltage generator.

2. The voltage generating apparatus of claim 1, wherein the voltage divider comprises:
   a plurality of resistors connected in series and dividing the external voltage into a plurality of node voltages, wherein the number of node voltages corresponds to the number of classes; and wherein
   the plurality of comparators comprises
   a first comparator comparing a first node voltage of the plurality of node voltages with the first reference voltage;
   remaining comparators of the plurality of comparators comparing respective remaining node voltages of the plurality of node voltages with the first reference voltage; and
   the logic circuit comprises a digital signal output unit buffering outputs of the plurality of comparators into a plurality of digital signals, and outputting the plurality of digital signals as the detection signals.

3. The voltage generating apparatus of claim 1, wherein the internal voltage generated is larger when the class to which the external voltage belongs corresponds to a larger predetermined voltage.

4. The voltage generating apparatus of claim 3, wherein the internal voltage generator comprises a plurality of resistors connected in series, and outputs a voltage across at least one of the resistors of the plurality of resistors in response to the detection signals as the internal voltage.

5. The voltage generating apparatus of claim 3, wherein the internal voltage generator comprises:
   a first resistor connected to the external voltage;
   a plurality of switches connected in series and selectively closed or opened in response to the detection signals; and
   a plurality of resistors connected in series between the first resistor and a ground, and respectively connected in parallel to the switches,
   wherein the internal voltage is a sum of a first voltage across at least one of the resistors connected to at least one opened switch in response to the detection signals, and a second voltage across the first resistor.

6. The voltage generating apparatus of claim 5, wherein the first voltage across at least one of the resistors is not higher than a second reference voltage.

7. The voltage generating apparatus of claim 6, further comprising a switching unit between the external voltage and the first resistor, wherein the switching unit is turned on if the second reference voltage is equal to or higher than the first voltage across at least one of the resistors.

8. A voltage generating method comprising:
   classifying an external voltage into a class of a plurality of classes, which correspond to predetermined voltages, to which the external voltage belongs;
   outputting a plurality of detection signals indicating the class to which the external voltage belongs with respect to a first reference voltage; and generating an internal voltage corresponding to the class to which the external voltage belongs, using the detection signals, wherein the step of outputting a plurality of detection signals comprises:

dividing the external voltage into a plurality of divided voltages;

comparing each of the divided voltages with the first reference voltage;

converting the comparison results into a plurality of digital signals; and outputting the plurality of digital signals as the detection signals, and wherein the step of outputting a plurality of detection signals comprises latching the plurality of detection signals in synchronization with a predetermined control signal and outputting the latched plurality of detection signals.

9. The voltage generating method of claim 8, wherein the external voltage is supplied from a mobile terminal, and the internal voltage is output to a smart card.

10. The voltage generating method of claim 8, wherein the step of comparing each of the divided voltages with the first reference voltage comprises:

amplifying a voltage difference between a first divided voltage of the plurality of divided voltages and the first reference voltage when the first divided voltage of the plurality of divided voltages is higher than the first reference voltage; and outputting substantially zero ("0") volts when remaining divided voltages of the plurality of divided voltages are higher than the first reference voltage.

11. The voltage generating method of claim 8, further comprising the step of performing logical operations on the plurality of digital signals, wherein output logic levels of the plurality of digital signals corresponding to the class to which the external voltage belongs is different from the output logic levels of the plurality of digital signals of other classes of the plurality of classes.

12. The voltage generating method of claim 8, wherein the step of generating an internal voltage comprises:

selectively connecting a first resistor to the external voltage in response to a predetermined switching signal;

selecting a second resistor, which is connected to the first resistor and corresponds to the class to which the external voltage belongs, according to the detection signals; and outputting a voltage across the first resistor and the second resistor as the internal voltage.

13. The voltage generating method of claim 12, wherein the predetermined switching signal is activated when a second reference voltage is equal to or higher than a voltage across the second resistor.

14. A voltage generating circuit comprising:

a class detector determining, with respect to a reference voltage, one class, to which an external voltage belongs, from a plurality of classes of external voltages, and providing a plurality of detection signals indicating the class;

an internal voltage generator, using the plurality of detection signals, providing one internal voltage, corresponding to the class to which the external voltage belongs, wherein the internal voltage is selected from a plurality of internal voltages, corresponding to the plurality of classes of external voltages, wherein the class detector includes a voltage divider receiving the external voltage and a plurality of comparators connected to the voltage divider and the first reference voltage and having respective outputs connected to a logic circuit having a plurality of logic elements, whereby a plurality of digital signals are produced as the detection signals corresponding to the plurality of classes; and a latch unit latching the detection signals output from the class detector in synchronization with a predetermined control signal, and outputting the latched detection signals to the internal voltage generator.

15. The voltage generating circuit of claim 14, wherein the internal voltage generator, using the plurality of detection signals, selects the internal voltage from a plurality of voltages which correspond to the plurality of classes and regulates the internal voltage, and the plurality of voltages is generated from the external voltage.

* * * * *